US011196451B2

(12) United States Patent
Hanaoka

(10) Patent No.: US 11,196,451 B2
(45) Date of Patent: Dec. 7, 2021

(54) HIGH-FREQUENCY MODULE, HIGH-FREQUENCY FRONT END CIRCUIT, AND COMMUNICATION DEVICE

(71) Applicant: Murata Manufacturing Co., Ltd., Kyoto (JP)

(72) Inventor: Kunitoshi Hanaoka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 92 days.

(21) Appl. No.: 16/815,369

(22) Filed: Mar. 11, 2020

(65) Prior Publication Data

US 2020/0212951 A1 Jul. 2, 2020

Related U.S. Application Data

(63) Continuation of application No. PCT/JP2018/031201, filed on Aug. 23, 2018.

(30) Foreign Application Priority Data

Sep. 12, 2017 (JP) .............................. JP2017-174828

(51) Int. Cl.
*H04B 1/40* (2015.01)
*H03F 3/68* (2006.01)
(Continued)

(52) U.S. Cl.
CPC ................ *H04B 1/40* (2013.01); *H03F 3/68* (2013.01); *H03H 9/0009* (2013.01); *H03H 9/64* (2013.01);
(Continued)

(58) Field of Classification Search
CPC ....... H04B 1/40; H03F 3/68; H03F 2200/165; H03F 2200/171; H03F 2200/294;
(Continued)

(56) References Cited

U.S. PATENT DOCUMENTS 10,270,419 B2   4/2019  Mizoguchi
2008/0290965 A1  11/2008  Pitschi et al.
(Continued)

FOREIGN PATENT DOCUMENTS

JP  2009517897 A   4/2009
JP  2014239379 A  12/2014
(Continued)

OTHER PUBLICATIONS

International Search Report issued in Patent Application No. PCT/JP2018/031201, dated Sep. 18, 2018.
(Continued)

*Primary Examiner* — Lee Nguyen
(74) *Attorney, Agent, or Firm* — Pearne & Gordon LLP

(57) ABSTRACT

A high-frequency module includes an antenna terminal, a transmission signal terminal, a reception signal terminal, a plurality of earth terminals, a switch, a transmission filter, a reception filter, and a multilayer board. The multilayer board includes a ground electrode arranged between the transmission filter and the reception filter. The plurality of earth terminals include a first earth terminal and a second earth terminal. When the high-frequency module is viewed in a direction perpendicular to a principal surface of the multilayer board, the reception signal terminal is provided between the antenna terminal and the transmission signal terminal, the first earth terminal is provided between the antenna terminal and the reception signal terminal, and the second earth terminal is provided between the reception signal terminal and the transmission signal terminal.

20 Claims, 14 Drawing Sheets

(51) Int. Cl.
*H03H 9/00* (2006.01)
*H03H 9/64* (2006.01)
*H03H 9/72* (2006.01)
*H05K 1/02* (2006.01)
*H05K 1/18* (2006.01)
*H05K 5/06* (2006.01)

(52) U.S. Cl.
CPC ........... *H03H 9/725* (2013.01); *H05K 1/0243* (2013.01); *H05K 1/182* (2013.01); *H05K 5/065* (2013.01); *H03F 2200/165* (2013.01); *H03F 2200/171* (2013.01); *H03F 2200/294* (2013.01); *H03F 2200/451* (2013.01); *H05K 2201/1006* (2013.01); *H05K 2201/10053* (2013.01); *H05K 2201/10098* (2013.01)

(58) Field of Classification Search
CPC .. H03F 2200/451; H03H 9/0009; H03H 9/64; H03H 9/725; H05K 1/0243; H05K 1/182; H05K 5/065; H05K 2201/10053; H05K 2201/1006; H05K 2201/10098
USPC .......................................................... 455/73
See application file for complete search history.

(56) References Cited

U.S. PATENT DOCUMENTS

| | | |
|---|---|---|
| 2011/0279194 A1 | 11/2011 | Furutani |
| 2013/0314174 A1 | 11/2013 | Kato |
| 2014/0354374 A1* | 12/2014 | Kawachi .............. H03H 9/0571 333/133 |

FOREIGN PATENT DOCUMENTS

| | | |
|---|---|---|
| JP | 2015018932 A | 1/2015 |
| WO | 2010-087309 A1 | 8/2010 |
| WO | 2010087304 A1 | 8/2010 |
| WO | 2012-105373 A1 | 8/2012 |
| WO | 2017-138405 A1 | 8/2017 |

OTHER PUBLICATIONS

Written Opinion issued in Patent Application No. PCT/JP2018/031201, dated Sep. 18, 2018.

* cited by examiner

HIGH-FREQUENCY MODULE, HIGH-FREQUENCY FRONT END CIRCUIT, AND COMMUNICATION DEVICE

This is a continuation of International Application No. PCT/JP2018/031201 filed on Aug. 23, 2018 which claims priority from Japanese Patent Application No. 2017-174828 filed on Sep. 12, 2017. The contents of these applications are incorporated herein by reference in their entireties.

BACKGROUND OF THE DISCLOSURE

1. Field of the Disclosure

The present disclosure relates to a high-frequency module including a transmission filter and a reception filter, and relates to a high-frequency front end circuit and a communication device.

2. Description of the Related Art

A high-frequency module including a transmission filter and a reception filter is known as a component of a high-frequency front end circuit to be provided in mobile communication devices. As an example of this type of high-frequency module, Japanese Unexamined Patent Application Publication No. 2014-239379 describes a high-frequency module including a board, a plurality of filters and a switch mounted on the board, and a plurality of outer terminals connected to the plurality of filters and the like. The plurality of outer terminals include an input terminal, an output terminal, an earth terminal, and an antenna terminal to be connected to an antenna element. The plurality of outer terminals are copper posts and arranged on a mounting surface of the board.

Along with recent trends toward small-size and multi-band mobile communication devices, there is a demand to downsize the high-frequency module and increase its packing density. It is therefore necessary to reduce the distances between the outer terminals arranged on the mounting surface. However, a problem arises in that the degree of isolation between the plurality of outer terminals such as the input terminal, the output terminal, and the antenna terminal decreases when the distances between the outer terminals are reduced.

BRIEF SUMMARY OF THE DISCLOSURE

The present disclosure has been made to solve the problem described above and it is therefore an object thereof to suppress a decrease in the degree of isolation between the outer terminals of a high-frequency module.

According to preferred embodiments of the present disclosure, there is provided a high-frequency module including an antenna terminal, a transmission signal terminal, a reception signal terminal, a plurality of earth terminals, a switch connected to the antenna terminal, a transmission filter arranged in a path connecting the switch and the transmission signal terminal and connected to the switch and the transmission signal terminal, a reception filter arranged in a path connecting the switch and the reception signal terminal and connected to the switch and the reception signal terminal, and a multilayer board provided with the antenna terminal, the transmission signal terminal, the reception signal terminal, the plurality of earth terminals, the switch, the transmission filter, and the reception filter. The multilayer board includes a ground electrode arranged between the transmission filter and the reception filter and connected to the earth terminals. The plurality of earth terminals include a first earth terminal that is one of the plurality of earth terminals, and a second earth terminal different from the first earth terminal. When the high-frequency module is viewed in a direction perpendicular to a principal surface of the multilayer board, the reception signal terminal is provided between the antenna terminal and the transmission signal terminal, the first earth terminal is provided between the antenna terminal and the reception signal terminal, and the second earth terminal is provided between the reception signal terminal and the transmission signal terminal.

As described above, the first earth terminal is provided between the antenna terminal and the reception signal terminal, thereby being capable of suppressing a decrease in the degree of isolation between the antenna terminal and the reception signal terminal. The second earth terminal is provided between the reception signal terminal and the transmission signal terminal, thereby being capable of suppressing a decrease in the degree of isolation between the reception signal terminal and the transmission signal terminal. The ground electrode is arranged between the transmission filter and the reception filter, thereby being capable of securing isolation between the transmission filter and the reception filter.

According to preferred embodiments of the present disclosure, there is provided a high-frequency module including an antenna terminal, a transmission signal terminal, a reception signal terminal, a plurality of earth terminals, a switch connected to the antenna terminal, a transmission filter arranged in a path connecting the switch and the transmission signal terminal and connected to the switch and the transmission signal terminal, a reception filter arranged in a path connecting the switch and the reception signal terminal and connected to the switch and the reception signal terminal, and a multilayer board provided with the antenna terminal, the transmission signal terminal, the reception signal terminal, the plurality of earth terminals, the switch, the transmission filter, and the reception filter. The multilayer board includes a ground electrode arranged between the transmission filter and the reception filter and connected to the earth terminals. The plurality of earth terminals include a first earth terminal that is one of the plurality of earth terminals, and a second earth terminal different from the first earth terminal. When the high-frequency module is viewed in a direction perpendicular to a principal surface of the multilayer board, the transmission signal terminal is provided between the antenna terminal and the reception signal terminal, the first earth terminal is provided between the antenna terminal and the transmission signal terminal, and the second earth terminal is provided between the transmission signal terminal and the reception signal terminal.

As described above, the first earth terminal is provided between the antenna terminal and the transmission signal terminal, thereby being capable of suppressing a decrease in the degree of isolation between the antenna terminal and the transmission signal terminal. The second earth terminal is provided between the transmission signal terminal and the reception signal terminal, thereby being capable of suppressing a decrease in the degree of isolation between the transmission signal terminal and the reception signal terminal. The ground electrode is arranged between the transmission filter and the reception filter, thereby being capable of securing isolation between the transmission filter and the reception filter.

According to preferred embodiments of the present disclosure, there is provided a high-frequency module including an antenna terminal, a transmission signal terminal, a reception signal terminal, a plurality of earth terminals, a switch connected to the antenna terminal, a transmission filter arranged in a path connecting the switch and the transmission signal terminal and connected to the switch and the transmission signal terminal, a reception filter arranged in a path connecting the switch and the reception signal terminal and connected to the switch and the reception signal terminal, and a multilayer board provided with the antenna terminal, the transmission signal terminal, the reception signal terminal, the plurality of earth terminals, the switch, the transmission filter, and the reception filter. The multilayer board includes a ground electrode arranged between the transmission filter and the reception filter and connected to the earth terminals. The plurality of earth terminals include a first earth terminal that is one of the plurality of earth terminals, and a second earth terminal different from the first earth terminal. When the high-frequency module is viewed in a direction perpendicular to a principal surface of the multilayer board, the antenna terminal is provided between the reception signal terminal and the transmission signal terminal, the first earth terminal is provided between the reception signal terminal and the antenna terminal, and the second earth terminal is provided between the antenna terminal and the transmission signal terminal.

As described above, the first earth terminal is provided between the reception signal terminal and the antenna terminal, thereby being capable of suppressing a decrease in the degree of isolation between the reception signal terminal and the antenna terminal. The second earth terminal is provided between the antenna terminal and the transmission signal terminal, thereby being capable of suppressing a decrease in the degree of isolation between the antenna terminal and the transmission signal terminal. The ground electrode is arranged between the transmission filter and the reception filter, thereby being capable of securing isolation between the transmission filter and the reception filter.

According to preferred embodiments of the present disclosure, a sealing resin layer may be provided on one principal surface of the multilayer board. The antenna terminal, the transmission signal terminal, the reception signal terminal, and the plurality of earth terminals may be provided on the one principal surface of the multilayer board to extend through the sealing resin layer in a thickness direction.

Accordingly, it is possible to suppress a decrease in the degree of isolation among the antenna terminal, the transmission signal terminal, and the reception signal terminal. Further, it is possible to suppress the decrease in the degree of isolation among the antenna terminal, the transmission signal terminal, and the reception signal terminal even if the terminals are arranged with a smaller pitch.

According to preferred embodiments of the present disclosure, the antenna terminal may be a plurality of antenna terminals, the transmission signal terminal may be a plurality of transmission signal terminals, and the reception signal terminal may be a plurality of reception signal terminals.

Even if the plurality of antenna terminals, the plurality of transmission signal terminals, and the plurality of reception signal terminals are provided, the decrease in the degree of isolation among the outer terminals that are the antenna terminals, the transmission signal terminals, and the reception signal terminals can be suppressed by providing the first earth terminal or the second earth terminal between the respective terminals.

According to preferred embodiments of the present disclosure, the transmission filter may be provided on the one principal surface or another principal surface of the multilayer board. The reception filter may be provided on the one principal surface or the other principal surface where the transmission filter is not provided.

Thus, isolation between the transmission filter and the reception filter can be secured by providing the transmission filter and the reception filter on different surfaces of the multilayer board.

According to preferred embodiments of the present disclosure, the switch may be provided on the other principal surface.

The area of the other principal surface can effectively be used by providing the switch on the other principal surface where the antenna terminal, the transmission signal terminal, and the reception signal terminal are not provided. Thus, the high-frequency module can be downsized.

According to preferred embodiments of the present disclosure, the switch may be built in the multilayer board.

The area of the high-frequency module is reduced by mounting the switch in the multilayer board. Thus, the high-frequency module can be downsized.

According to preferred embodiments of the present disclosure, the switch may include one common terminal and a plurality of selection terminals. Each of the plurality of selection terminals may be connected to a corresponding one of the transmission filter and the reception filter. The common terminal may be connected to the antenna terminal and may simultaneously be connected to the transmission filter and the reception filter with the plurality of selection terminals interposed therebetween.

Accordingly, the high-frequency module can simultaneously transmit and receive signals by using the transmission filter and the reception filter. Further, isolation between the transmission filter and the reception filter can be secured even if signals are transmitted and received simultaneously. Further, it is possible to suppress a decrease in the degree of isolation among the antenna terminal, the transmission signal terminal, and the reception signal terminal.

According to preferred embodiments of the present disclosure, the ground electrode may include a first ground electrode connected to a ground terminal of the transmission filter, and a second ground electrode connected to a ground terminal of the reception filter. The first ground electrode and the second ground electrode may be separated from each other inside the multilayer board without being connected to each other.

Thus, isolation between the transmission filter and the reception filter can be secured by separating the ground electrode connected to the transmission filter and the ground electrode connected to the reception filter without connecting the ground electrodes.

According to preferred embodiments of the present disclosure, there is provided a high-frequency front end circuit including the high-frequency module described above, a power amplifier connected to the transmission signal terminal of the high-frequency module, and a low-noise amplifier connected to the reception signal terminal of the high-frequency module.

A decrease in the quality of high-frequency signals to be inputted to and outputted from the high-frequency front end circuit can be suppressed because the high-frequency front end circuit includes the high-frequency module in which a decrease in the degree of isolation between the outer terminals is suppressed.

According to preferred embodiments of the present disclosure, there is provided a communication device including the high-frequency front end circuit described above, and a signal processing device configured to process a high-frequency signal.

The communication quality of the communication device can be improved because the communication device includes the high-frequency front end circuit in which a decrease in the quality of high-frequency signals is suppressed.

Other features, elements, characteristics and advantages of the present disclosure will become more apparent from the following detailed description of preferred embodiments of the present disclosure (with reference to the attached drawings).

DETAILED DESCRIPTION OF THE DISCLOSURE

Figure 1:
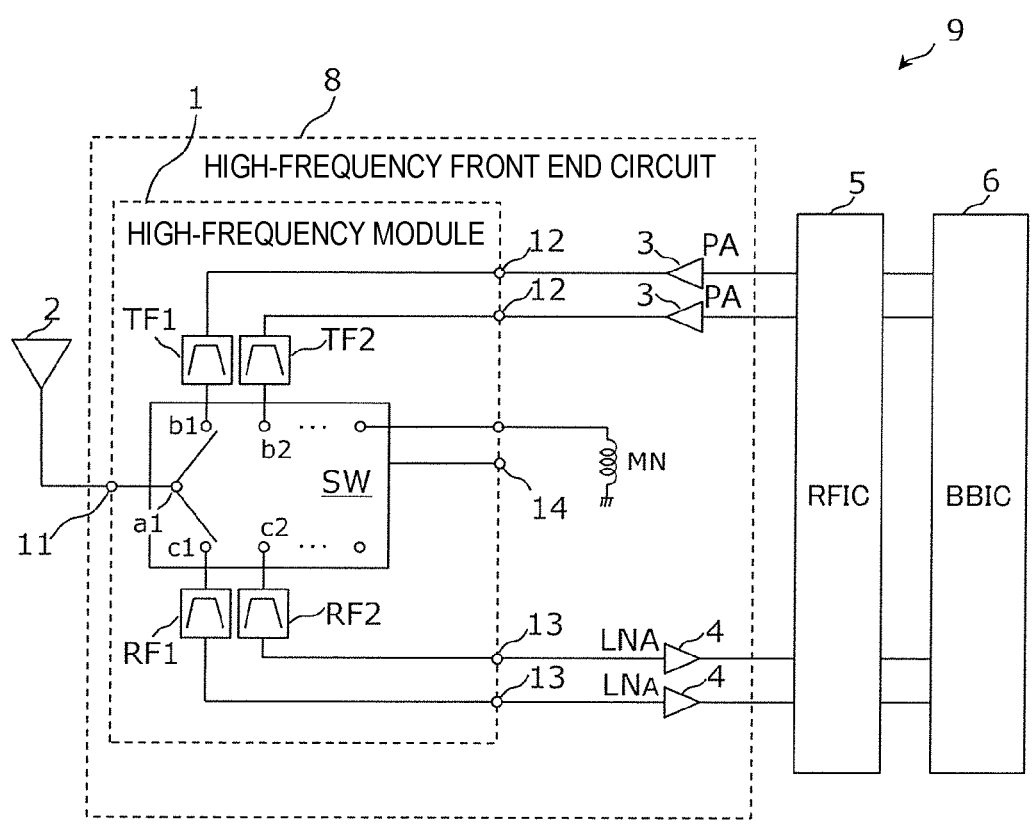
FIG. 1 is a circuit structure diagram illustrating a high-frequency module, a high-frequency front end circuit, and a communication device according to a first embodiment.

High-frequency modules and other devices according to embodiments of the present disclosure are described below with reference to the drawings. Each of the embodiments described below demonstrates a preferred specific example of the present disclosure. Numerical values, shapes, materials, constituent elements, arrangements and connection forms of the constituent elements, manufacturing steps, the order of the manufacturing steps, and the like described in the following embodiments are examples. In the drawings, substantially the same components are represented by the same reference symbols and redundant description is omitted or simplified.

First Embodiment

[1-1. Circuit Structures of High-Frequency Module, High-Frequency Front End Circuit, and Communication Device]

Circuit structures of a high-frequency module 1, a high-frequency front end circuit 8, and a communication device 9 of a first embodiment are described first with reference to FIG. 1. FIG. 1 is a circuit structure diagram illustrating the high-frequency module 1, the high-frequency front end circuit 8, and the communication device 9.

The communication device 9 includes the high-frequency front end circuit 8, an RFIC (RF signal processing circuit) 5, and a BBIC (baseband signal processing circuit) 6. For example, the communication device 9 is arranged at the front end portion of a mobile phone compatible with multiple modes and multiple bands. In the example illustrated in FIG. 1, an antenna element 2 is also provided in addition to the communication device 9.

The antenna element 2 is a multi-band antenna compliant with a communication scheme such as LTE and configured to transmit and receive high-frequency signals. The antenna element 2 may be built in the communication device 9.

The RFIC 5 is an RF signal processing circuit configured to process high-frequency signals to be transmitted and received by the antenna element 2. Specifically, the RFIC 5 performs signal processing such as down-conversion for a high-frequency signal (high-frequency reception signal in this case) inputted from the antenna element 2 via a reception signal path of the high-frequency front end circuit 8 and outputs a reception signal generated by the signal processing to the BBIC 6. The RFIC 5 also performs signal processing such as up-conversion for a transmission signal inputted from the BBIC 6 and outputs a high-frequency signal (high-frequency transmission signal in this case) generated by the signal processing to a transmission signal path of the high-frequency front end circuit 8.

The BBIC 6 is a circuit configured to process signals by using an intermediate frequency band lower than that of a high-frequency signal in the high-frequency front end circuit 8.

The high-frequency front end circuit 8 includes the high-frequency module 1, and the power amplifiers 3 and low-noise amplifiers 4 connected to the high-frequency module 1. The high-frequency front end circuit 8 causes the power amplifiers 3 to amplify a high-frequency signal outputted from the RFIC 5 and outputs the high-frequency signal to the antenna element 2 via the high-frequency module 1. The high-frequency front end circuit 8 inputs a high-frequency signal received by the antenna element 2 to the low-noise amplifiers 4 via the high-frequency module 1, causes the low-noise amplifiers 4 to amplify the high-frequency signal, and outputs the high-frequency signal to the RFIC 5.

The high-frequency module 1 includes an antenna terminal 11 connected to the antenna element 2, a switch SW, transmission filters TF1 and TF2, reception filters RF1 and RF2, transmission signal terminals 12, and reception signal terminals 13. Hereinafter, a term "transmission filter TF" may be used to indicate one or both of the plurality of transmission filters TF1 and TF2 and a term "reception filter RF" may be used to indicate one or both of the plurality of reception filters RF1 and RF2.

The switch SW connects the antenna element 2 to a signal path corresponding to a predetermined band in response to a control signal inputted from a controller (not illustrated) via a control terminal 14. For example, the switch SW includes one common terminal a1 and a plurality of selection terminals b1, b2, c1, and c2.

The common terminal a1 is connected to the antenna terminal 11. Each of the plurality of selection terminals b1, b2, c1, and c2 is connected to a corresponding one of the transmission filters TF1 and TF2 and the reception filters RF1 and RF2. Specifically, the selection terminal b1 is connected to the transmission filter TF1, the selection terminal b2 is connected to the transmission filter TF2, the selection terminal c1 is connected to the reception filter RF1, and the selection terminal c1 is connected to the reception filter RF2.

In this embodiment, the switch SW simultaneously forms two or more transmission/reception paths so that the high-frequency module 1 may simultaneously transmit and receive signals by using the transmission filter TF and the reception filter RF. For example, the common terminal a1 may be connected to both of the plurality of selection terminals b1 and c1 to achieve a state in which the antenna element 2 is simultaneously connected to the transmission filter TF1 and the reception filter RF1. A matching element MN may be connected between the switch SW and the transmission filter TF, between the switch SW and the reception filter RF, between the transmission filter TF and the power amplifier 3, or between the reception filter RF and the low-noise amplifier 4.

The transmission filter TF is arranged in a path connecting the switch SW and the transmission signal terminal 12 and is connected to the switch SW and the transmission signal terminal 12. The transmission filter TF filters a high-frequency signal amplified by the power amplifier 3 and inputted via the transmission signal terminal 12 to pass a signal in a transmission frequency band. The transmission signal outputted from the transmission filter TF is outputted to the antenna element 2 via the antenna terminal 11.

The reception filter RF is arranged in a path connecting the switch SW and the reception signal terminal 13 and is connected to the switch SW and the reception signal terminal 13. The reception filter RF filters a high-frequency signal inputted via the antenna element 2 and the antenna terminal 11 to pass a signal in a reception frequency band. The reception signal outputted from the reception filter RF is outputted to the low-noise amplifier 4 via the reception signal terminal 13.

[1-2. Structure of High-Frequency Module]

Figure 2:
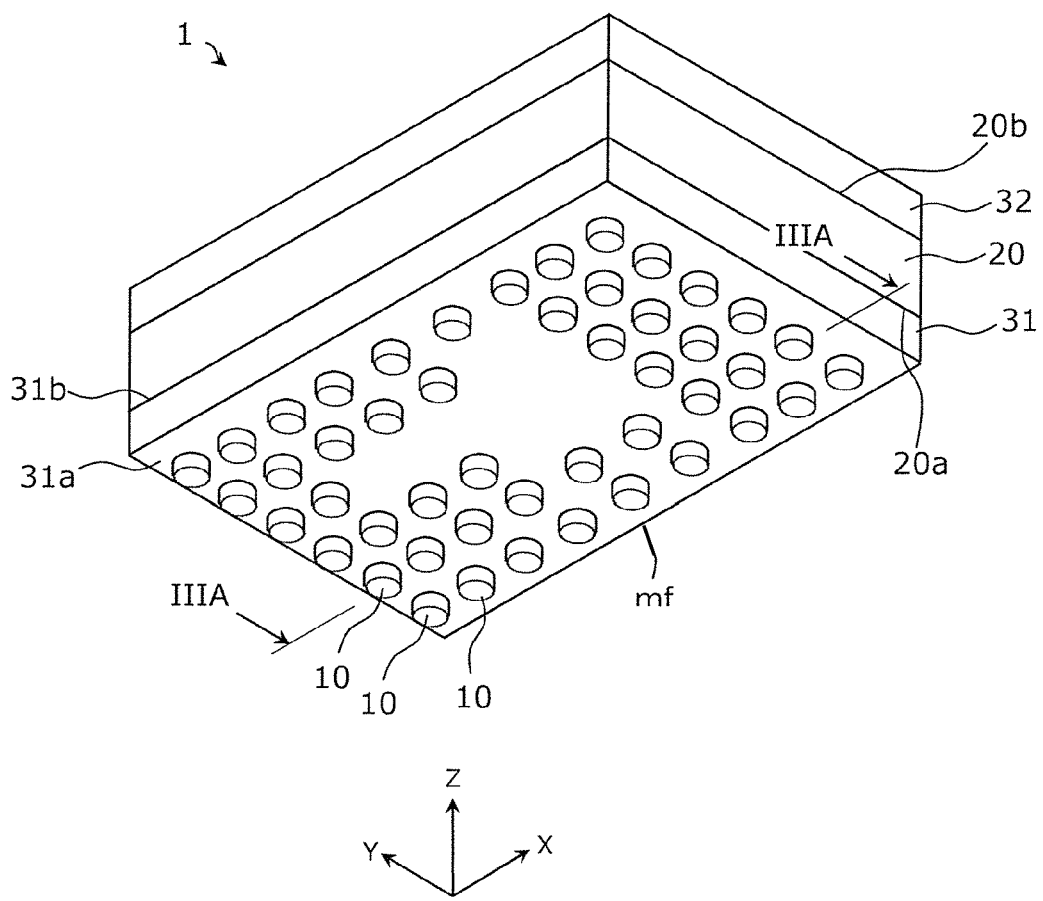
FIG. 2 is a perspective view of the high-frequency module according to the first embodiment that is viewed obliquely from the bottom.

Next, the structure of the high-frequency module 1 is described with reference to FIG. 2 to FIG. 3B. FIG. 2 is a perspective view of the high-frequency module 1 that is viewed obliquely from the bottom.

The high-frequency module 1 includes a substantially rectangular parallelepiped multilayer board 20, a sealing resin layer 31 provided on one principal surface 20a of the multilayer board 20, and a sealing resin layer 32 provided on the other principal surface 20b of the multilayer board 20. Examples of materials for the sealing resin layers 31 and 32 include a thermosetting resin material such as an epoxy resin.

The sealing resin layer 31 has two principal surfaces 31a and 31b. The principal surface 31a opposite to the principal surface 31b that is in contact with the multilayer board 20 is a mounting surface mf when the high-frequency module 1 is mounted on a mother board or the like. A plurality of outer terminals 10 are exposed on the principal surface 31a. The mounting surface mf is a surface that faces the mother board or the like when the high-frequency module 1 is mounted on the mother board.

Hereinafter, a direction perpendicular to the principal surface 31a is referred to as a Z direction, a direction in which the plurality of outer terminals 10 are arrayed is referred to as an X direction, and a direction perpendicular to both the X direction and the Z direction is referred to as a Y direction.

Figure 3A:
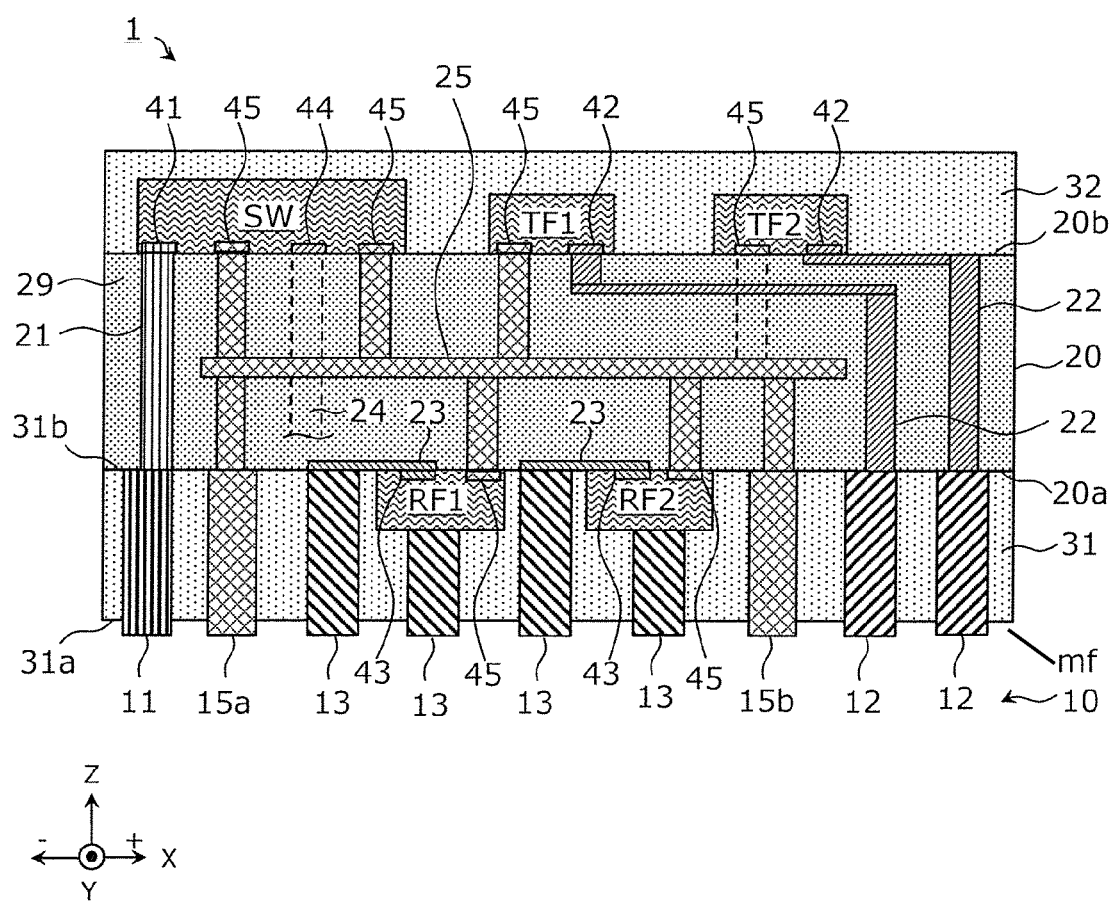
FIG. 3A is a schematic cross-sectional view of the high-frequency module according to the first embodiment that is cut along the line IIIA-IIIA in FIG. 2.

FIG. 3A is a schematic cross-sectional view of the high-frequency module 1 that is cut along the line IIIA-IIIA in FIG. 2. As illustrated in FIG. 3A, the high-frequency module 1 includes the multilayer board 20, the switch SW, the plurality of transmission filters TF1 and TF2, and the plurality of reception filters RF1 and RF2.

The multilayer board 20 includes a base portion 29 formed by stacking a plurality of base sheets, and signal electrodes 21, 22, and 23, a control electrode 24, and a ground electrode 25 provided inside the multilayer board 20 and on the surfaces of the multilayer board 20. Each of the signal electrodes 21 to 23, the control electrode 24, and the ground electrode 25 includes an internal conductor and interlayer conductors. For example, each of the signal electrodes 21 to 23, the control electrode 24, and the ground electrode 25 is formed of a metal material containing copper as a main component. The multilayer board 20 may be a board containing a ceramic material, a flexible board containing a resin material, or a printed circuit board.

One of the transmission filter TF and the reception filter RF is mounted on the one principal surface 20a of the multilayer board 20 and the other one of the transmission filter TF and the reception filter RF is mounted on the other principal surface 20b of the multilayer board 20. In this embodiment, the reception filter RF is mounted on the one principal surface 20a of the multilayer board 20 and the sealing resin layer 31 covers the reception filter RF. The switch SW and the transmission filter TF are mounted on the other principal surface 20b of the multilayer board 20 and the sealing resin layer 32 covers the switch SW and the transmission filter TF. The ground electrode 25 is arranged between the transmission filter TF and the reception filter RF to suppress the interference between high-frequency signals in the transmission filter TF and the reception filter RF. The ground electrode 25 is arranged also between the switch SW and the reception filter RF.

The plurality of outer terminals 10 are provided on the one principal surface 20a of the multilayer board 20. Each outer terminal 10 is a substantially columnar conductor extending through the sealing resin layer 31 in its thickness direction (Z direction) and exposed on the principal surface 31a of the sealing resin layer 31. Specifically, one end of the outer terminal 10 abuts against the one principal surface 20a of the multilayer board 20 and the other end of the outer terminal 10 protrudes from the principal surface 31a of the sealing resin layer 31. To mount the high-frequency module 1 on the mother board, the exposed portion of the outer terminal 10 is soldered to the mother board.

The plurality of outer terminals 10 include one or more antenna terminals 11, one or more transmission signal terminals 12, one or more reception signal terminals 13, one or more control terminals 14, and a plurality of earth terminals 15. The plurality of earth terminals 15 include a first earth terminal 15a that is one of the plurality of earth terminals 15, and a second earth terminal 15b different from the first earth terminal 15a. Each of the antenna terminals 11, the transmission signal terminals 12, the reception signal terminals 13, and the earth terminals 15a and 15b is connected to a corresponding circuit element out of the switch SW, the transmission filter TF, and the reception filter RF with the signal electrodes 21 to 23, the control electrode 24, or the ground electrode 25 interposed therebetween.

The switch SW is a semiconductor circuit device including semiconductor elements such as switching elements. The switch SW has a substantially rectangular parallelepiped external shape. An input/output terminal 41 extended from the common terminal a1, a plurality of signal terminals (not illustrated) extended from the selection terminals b1, b2, c1, and c2, and ground terminals 45 are provided on the bottom surface of the switch SW. The input/output terminal 41 is connected to the antenna terminal 11 with the signal electrode 21 interposed therebetween. Each of the plurality of signal terminals is connected to the transmission filter TF or the reception filter RF with the signal electrode 21 interposed therebetween (not illustrated). The ground terminal 45 of the switch SW is connected to the earth terminals 15a and 15b with the ground electrode 25 interposed therebetween. The switch SW has a control terminal 44 different from the input/output terminal 41, the signal terminals, and the ground terminals 45. The control terminal 44 is connected to the control terminal 14 (see FIG. 3B) with the control electrode 24 interposed therebetween.

Examples of the transmission filter TF include a SAW (Surface Acoustic Wave) filter including an IDT (Interdigital Transducer) electrode. The transmission filter TF has a substantially rectangular parallelepiped external shape. A signal terminal 42 and a ground terminal 45 extended from the IDT electrode are provided on the bottom surface of the transmission filter TF. The signal terminal 42 of the transmission filter TF1 is connected to one transmission signal terminal 12 (terminal located on a negative side of the X direction out of the two transmission signal terminals 12 illustrated in FIG. 3A) with the signal electrode 22 interposed therebetween. The signal terminal 42 of the transmission filter TF2 is connected to the other transmission signal terminal 12 (terminal located on a positive side of the X direction out of the two transmission signal terminals 12 illustrated in FIG. 3A) with the signal electrode 22 interposed therebetween. The ground terminal 45 of each of the transmission filters TF1 and TF2 is connected to the earth terminal 15a and the earth terminal 15b with the ground electrode 25 interposed therebetween.

Examples of the reception filter RF include a SAW filter including an IDT electrode. The reception filter RF has a substantially rectangular parallelepiped external shape. A signal terminal 43 and a ground terminal 45 extended from the IDT electrode are provided on the bottom surface of the reception filter RF. The signal terminal 43 of the reception filter RF1 is connected to one set of reception signal terminals 13 (two terminals located on the negative side of the X direction out of the four reception signal terminals 13 illustrated in FIG. 3A) directly or with the signal electrode 23 interposed therebetween. The signal terminal 43 of the reception filter RF2 is connected to the other set of reception signal terminals 13 (two terminals located on the positive side of the X direction out of the four reception signal terminals 13 illustrated in FIG. 3A) directly or with the signal electrode 23 interposed therebetween. The ground terminal 45 of each of the reception filters RF1 and RF2 is connected to the earth terminal 15a and the earth terminal 15b with the ground electrode 25 interposed therebetween.

Figure 3B:
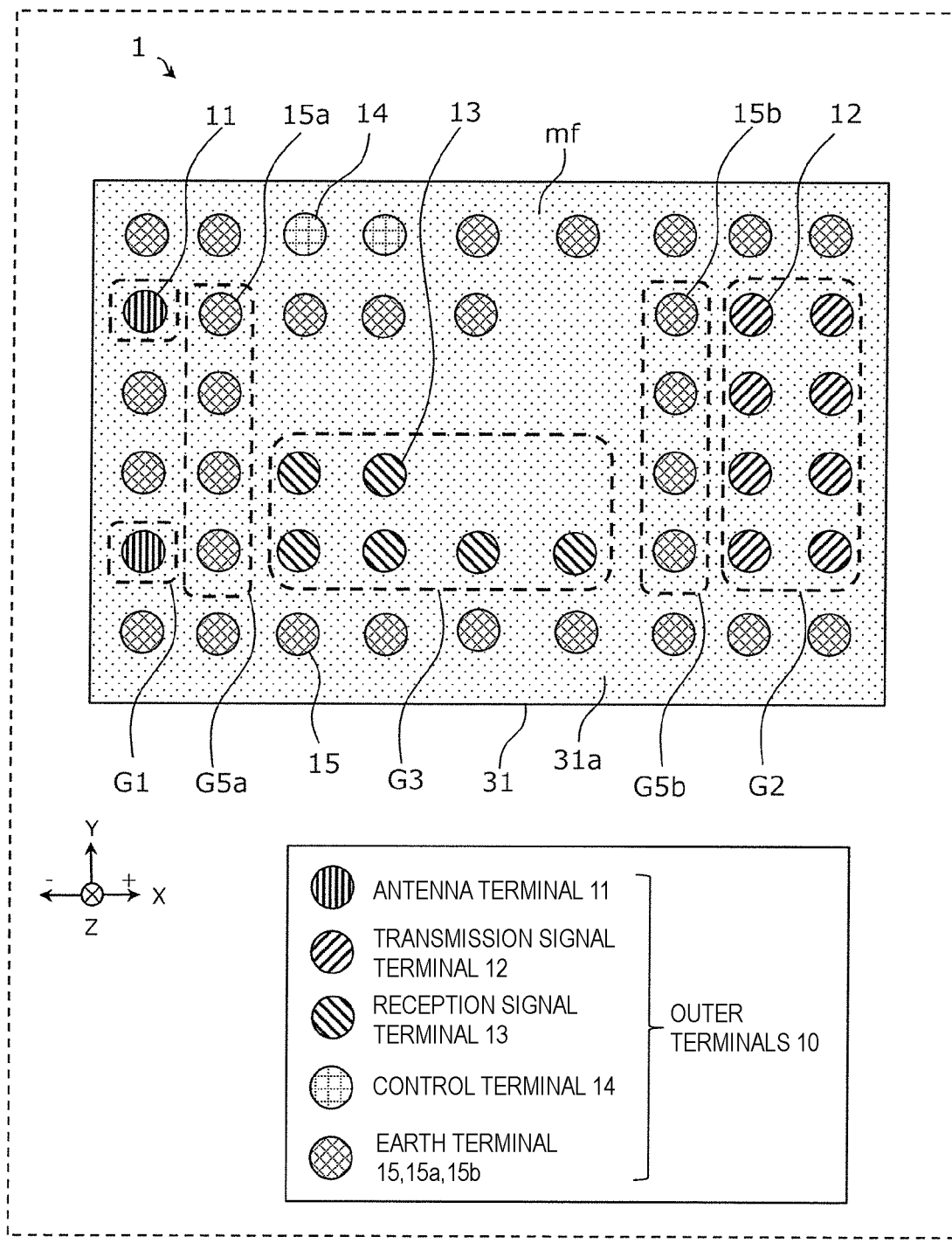
FIG. 3B is a plan view of the high-frequency module according to the first embodiment that is viewed from a mounting surface side.

FIG. 3B is a plan view of the high-frequency module 1 that is viewed from the mounting surface mf side. The mounting surface mf of the high-frequency module 1 has a substantially rectangular shape. The plurality of outer terminals 10 are arranged at the predetermined intervals along the long sides and the short sides of the mounting surface mf. Focusing on, for example, outer terminals 10 in a second row from the bottom out of the plurality of outer terminals 10, one antenna terminal 11, one first earth terminal 15a, four reception signal terminals 13, one second earth terminal 15b, and two transmission signal terminals 12 are arranged in this order along the long side. Two control terminals 14 connected to the switch SW are arranged near the upper long side.

In the high-frequency module 1, subsets of the plurality of outer terminals 10 are grouped. For example, two antenna terminals 11 arranged near the left short side constitute a terminal group G1 and eight transmission signal terminals 12 arranged near the right short side constitute a terminal group G2. Six reception signal terminals 13 arranged between the terminal group G1 and the terminal group G2 constitute a terminal group G3. Four first earth terminals 15a arranged between the terminal group G1 and the terminal group G3 constitute a terminal group G5a. Four second earth terminals 15b arranged between the terminal group G3 and the terminal group G2 constitute a terminal group G5b.

In the high-frequency module 1, the reception signal terminal 13 is provided between the antenna terminal 11 and the transmission signal terminal 12. The first earth terminal 15a is provided between the antenna terminal 11 and the reception signal terminal 13, thereby being capable of suppressing a decrease in the degree of isolation between the antenna terminal 11 and the reception signal terminal 13. The second earth terminal 15b is provided between the reception signal terminal 13 and the transmission signal terminal 12, thereby being capable of suppressing a decrease in the degree of isolation between the reception signal terminal 13 and the transmission signal terminal 12. The first earth terminal 15a and the second earth terminal 15b are provided between the antenna terminal 11 and the transmission signal terminal 12, thereby being capable of suppressing a decrease in the degree of isolation between the antenna terminal 11 and the transmission signal terminal 12.

In the high-frequency module 1, the ground electrode 25 connected to the earth terminals 15a and 15b is arranged between the transmission filter TF and the reception filter RF. With this structure, isolation between the transmission filter TF and the reception filter RF can be secured.

Second Embodiment

In a high-frequency module 1A of a second embodiment, the transmission filter TF and the reception filter RF of the first embodiment are arranged in reverse and the transmission signal terminal 12 and the reception signal terminal 13 of the first embodiment are arranged in reverse.

Figure 4A:
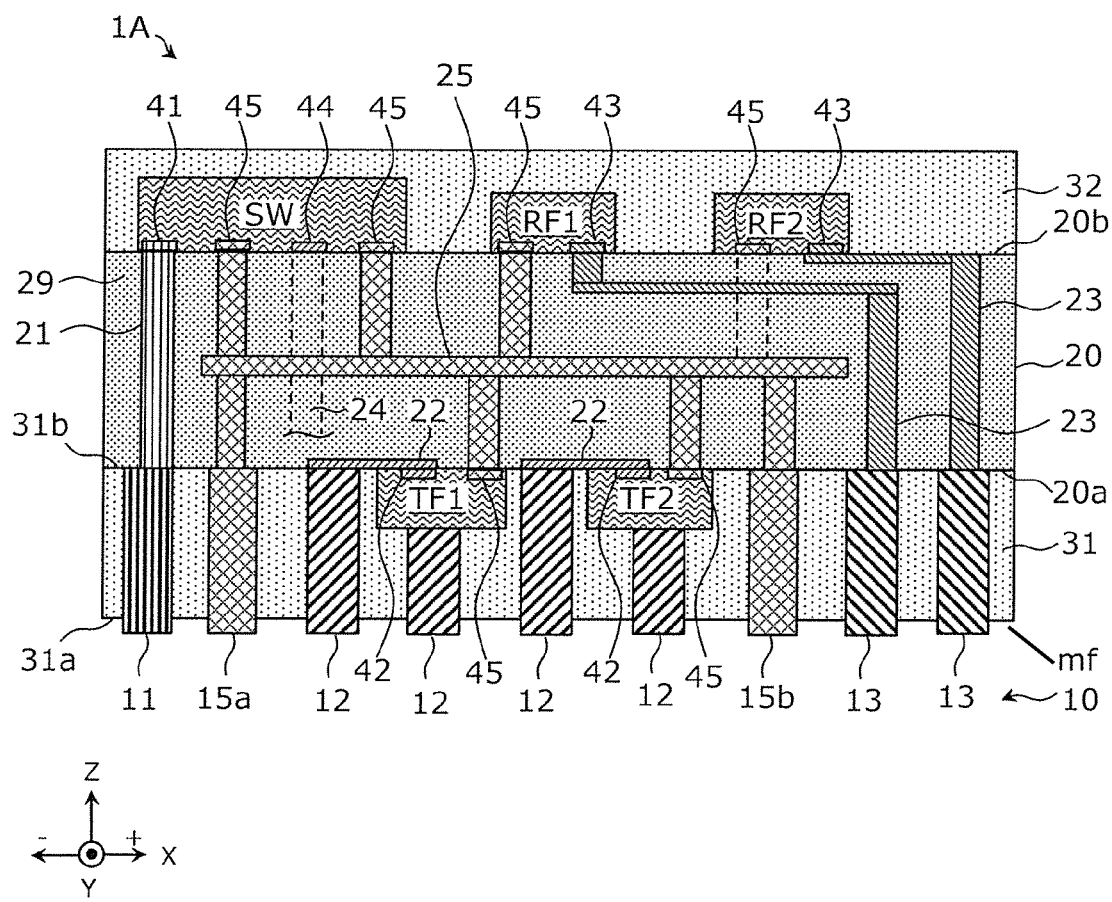
FIG. 4A is a schematic cross-sectional view of a high-frequency module according to a second embodiment.

FIG. 4A is a schematic cross-sectional view of the high-frequency module 1A according to the second embodiment. As illustrated in FIG. 4A, the high-frequency module 1A includes a multilayer board 20, a switch SW, a plurality of transmission filters TF1 and TF2, and a plurality of reception filters RF1 and RF2.

The transmission filter TF is mounted on one principal surface 20a of the multilayer board 20 and a sealing resin layer 31 covers the transmission filter TF. The switch SW and the reception filter RF are mounted on the other principal surface 20b of the multilayer board 20 and a sealing resin layer 32 covers the switch SW and the reception filter RF. A ground electrode 25 is arranged between the transmission filter TF and the reception filter RF. The ground electrode 25 is arranged also between the switch SW and the transmission filter TF.

A signal terminal 43 of the reception filter RF1 is connected to one reception signal terminal 13 (terminal located on a negative side of an X direction out of the two reception signal terminals 13 illustrated FIG. 4A) with a signal electrode 23 interposed therebetween. A signal terminal 43 of the reception filter RF2 is connected to the other reception signal terminal 13 (terminal located on a positive side of the X direction out of the two reception signal terminals 13 illustrated FIG. 4A) with a signal electrode 23 interposed therebetween. A ground terminal 45 of each of the reception filters RF1 and RF2 is connected to an earth terminal 15a and an earth terminal 15b with the ground electrode 25 interposed therebetween.

A signal terminal 42 of the transmission filter TF1 is connected to one set of transmission signal terminals (two terminals located on the negative side of the X direction out of the four transmission signal terminals 12 illustrated FIG. 4A) directly or with a signal electrode 22 interposed therebetween. A signal terminal 42 of the transmission filter TF2 is connected to the other set of transmission signal terminals 12 (two terminals located on the positive side of the X direction out of the four transmission signal terminals 12 illustrated FIG. 4A) directly or with a signal electrode 22 interposed therebetween. A ground terminal 45 of each of the transmission filters TF1 and TF2 is connected to the earth terminal 15a and the earth terminal 15b with the ground electrode 25 interposed therebetween.

Figure 4B:
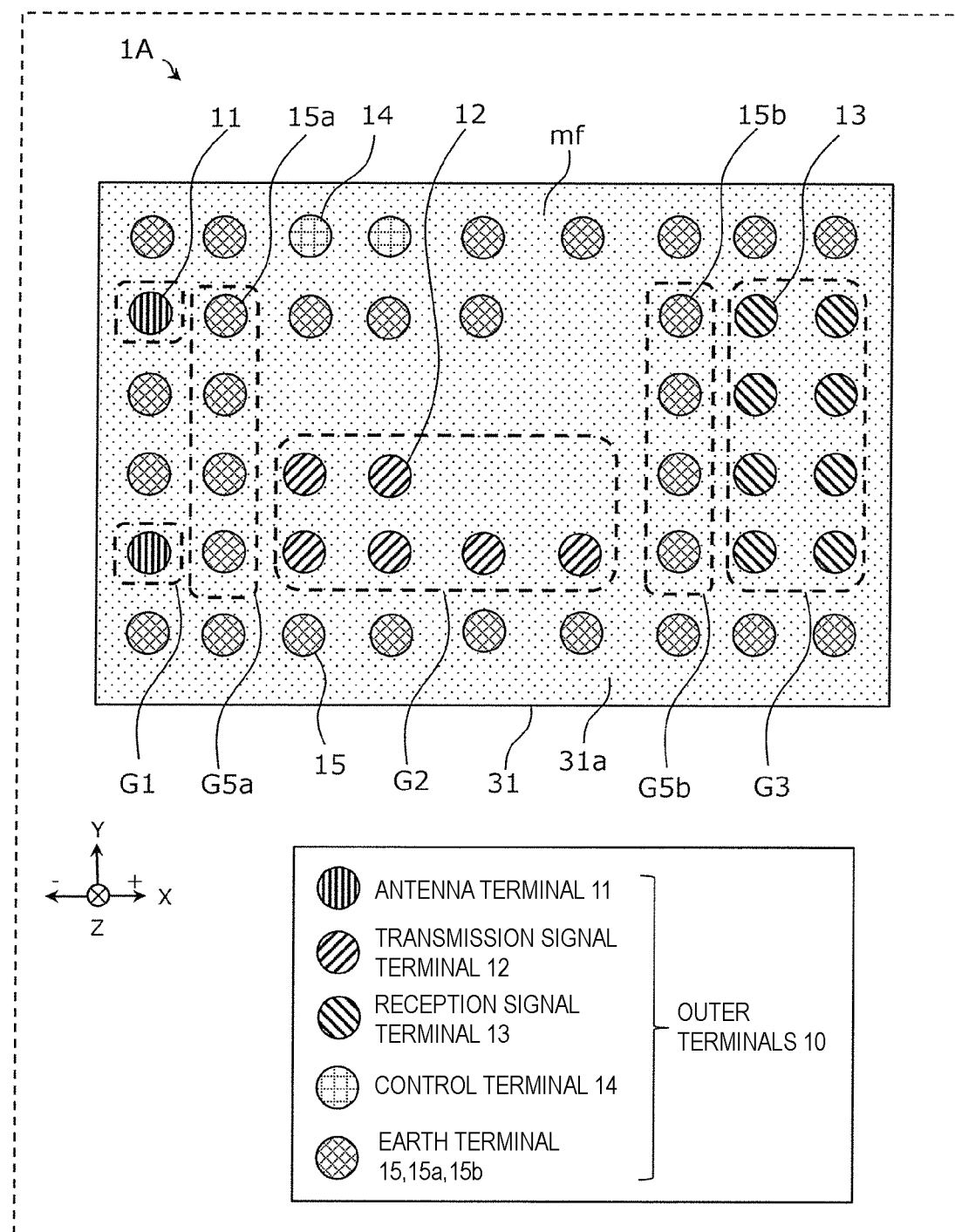
FIG. 4B is a plan view of the high-frequency module according to the second embodiment that is viewed from a mounting surface side.

FIG. 4B is a plan view of the high-frequency module 1A that is viewed from a mounting surface mf side. The mounting surface mf of the high-frequency module 1A has a substantially rectangular shape. A plurality of outer terminals 10 are arranged at the predetermined intervals along the long sides and the short sides of the mounting surface mf. Focusing on, for example, outer terminals 10 in a second row from the bottom out of the plurality of outer terminals 10, one antenna terminal 11, one first earth terminal 15a, four transmission signal terminals 12, one second earth terminal 15b, and two reception signal terminals 13 are arranged in this order along the long side.

In the high-frequency module 1A, subsets of the plurality of outer terminals 10 are grouped. For example, two antenna terminals 11 arranged near the left short side constitute a terminal group G1 and eight reception signal terminals 13 arranged near the right short side constitute a terminal group G3. Six transmission signal terminals 12 arranged between the terminal group G1 and the terminal group G3 constitute a terminal group G2. Four first earth terminals 15a arranged between the terminal group G1 and the terminal group G2 constitute a terminal group G5a. Four second earth terminals 15b arranged between the terminal group G2 and the terminal group G3 constitute a terminal group G5b.

In the high-frequency module 1A, the transmission signal terminal 12 is provided between the antenna terminal 11 and the reception signal terminal 13. The first earth terminal 15a is provided between the antenna terminal 11 and the transmission signal terminal 12, thereby being capable of suppressing a decrease in the degree of isolation between the antenna terminal 11 and the transmission signal terminal 12. The second earth terminal 15b is provided between the transmission signal terminal 12 and the reception signal terminal 13, thereby being capable of suppressing a decrease in the degree of isolation between the transmission signal terminal 12 and the reception signal terminal 13. The first earth terminal 15a and the second earth terminal 15b are provided between the antenna terminal 11 and the reception signal terminal 13, thereby being capable of suppressing a decrease in the degree of isolation between the antenna terminal 11 and the reception signal terminal 13.

In the high-frequency module 1A, the ground electrode 25 connected to the earth terminals 15a and 15b is arranged between the transmission filter TF and the reception filter RF. With this structure, isolation between the transmission filter TF and the reception filter RF can be secured.

Modified Example of Second Embodiment

In a high-frequency module 1B of a modified example of the second embodiment, the transmission signal terminals 12 of the second embodiment are arranged along the short sides of the mounting surface mf.

Figure 5:
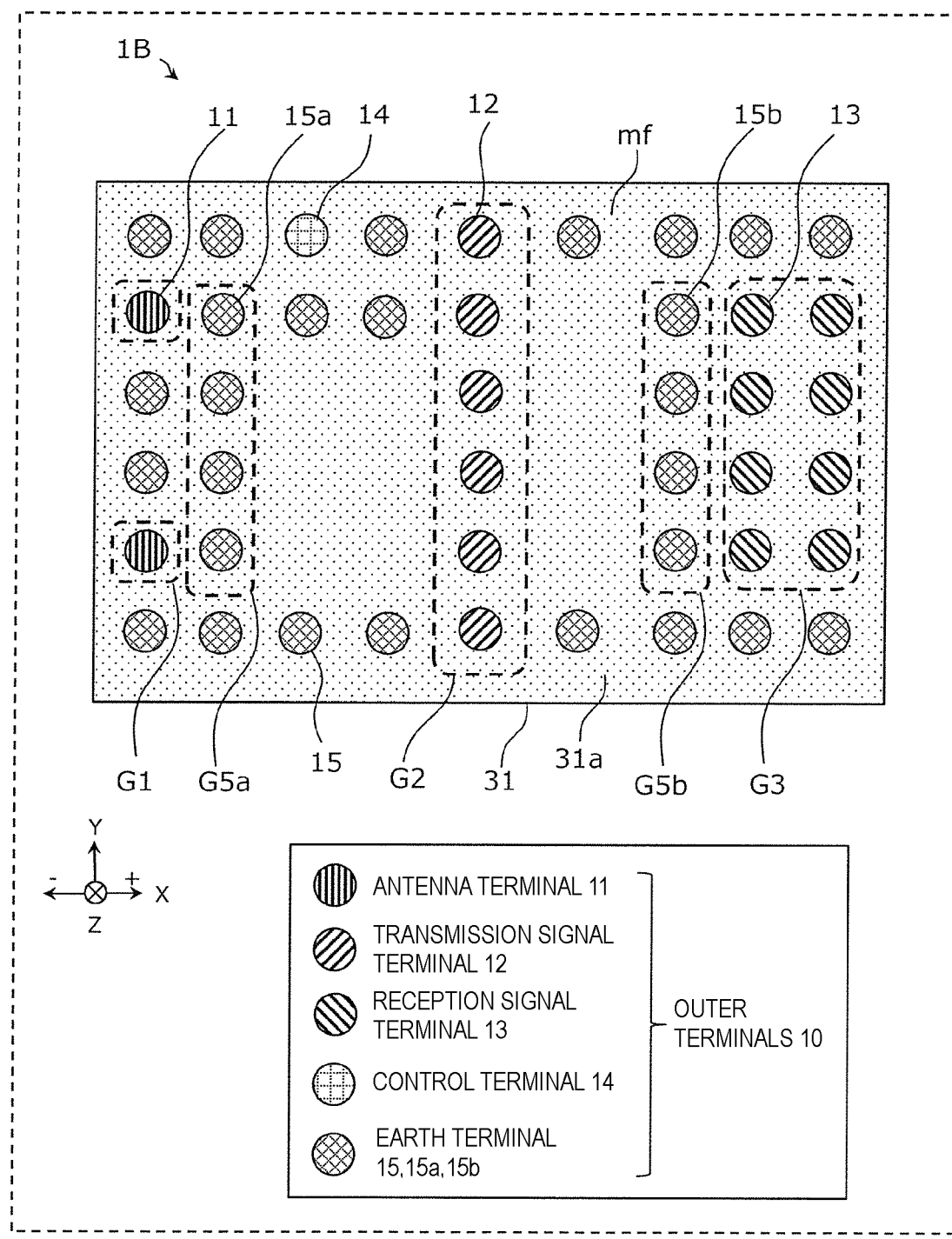
FIG. 5 is a plan view of a high-frequency module according to a modified example of the second embodiment that is viewed from a mounting surface side.

FIG. 5 is a plan view of the high-frequency module 1B according to the modified example of the second embodiment that is viewed from the mounting surface mf side.

In the high-frequency module 1B of the modified example as well, the transmission signal terminal 12 is provided between the antenna terminal 11 and the reception signal terminal 13. The first earth terminal 15a is provided between the antenna terminal 11 and the transmission signal terminal 12, thereby being capable of suppressing the decrease in the degree of isolation between the antenna terminal 11 and the transmission signal terminal 12. The second earth terminal 15b is provided between the transmission signal terminal 12 and the reception signal terminal 13, thereby being capable of suppressing the decrease in the degree of isolation between the transmission signal terminal 12 and the reception signal terminal 13. The first earth terminal 15a and the second earth terminal 15b are provided between the antenna terminal 11 and the reception signal terminal 13, thereby being capable of suppressing the decrease in the degree of isolation between the antenna terminal 11 and the reception signal terminal 13.

Third Embodiment

In a high-frequency module 1C of the third embodiment, the antenna terminal 11 of the first embodiment is arranged between the transmission signal terminal 12 and the reception signal terminal 13.

Figure 6A:
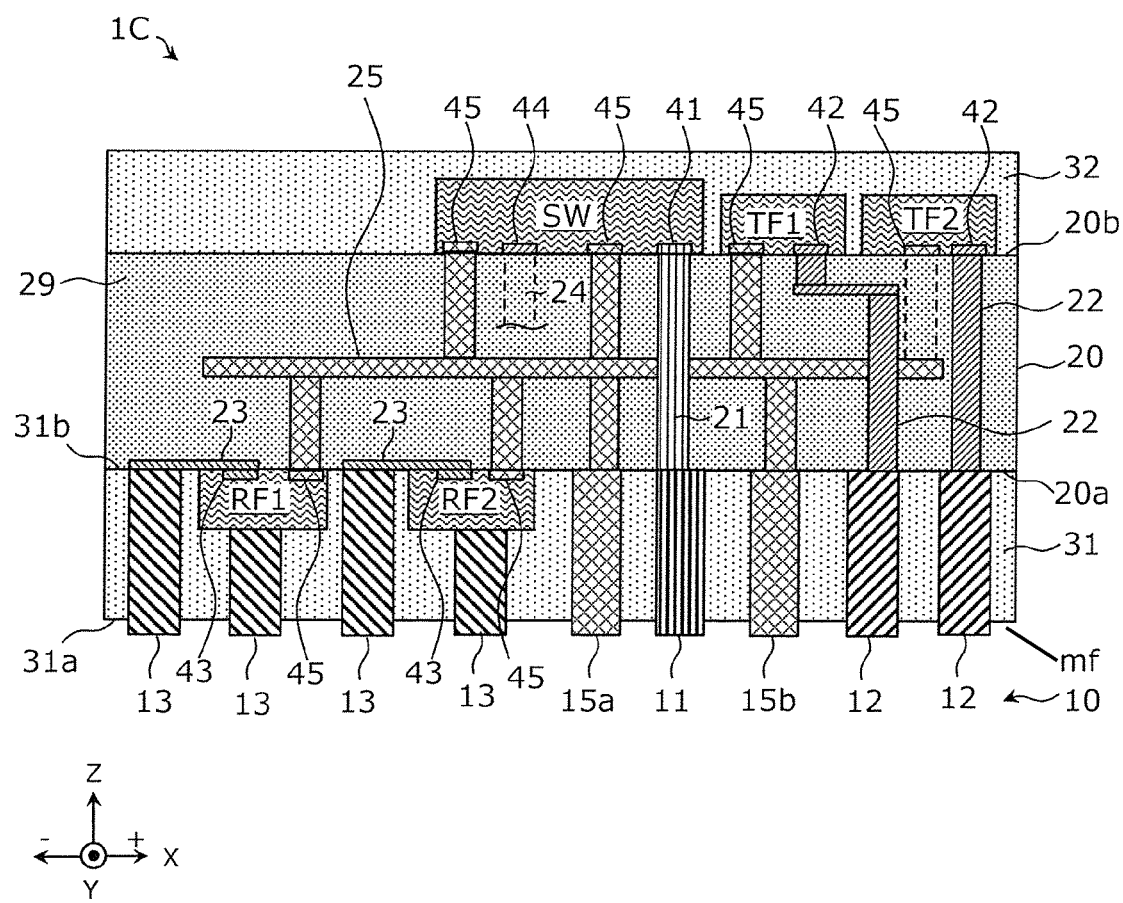
FIG. 6A is a schematic cross-sectional view of a high-frequency module according to a third embodiment.

FIG. 6A is a schematic cross-sectional view of the high-frequency module 1C according to the third embodiment. As illustrated in FIG. 6A, the high-frequency module 1C includes a multilayer board 20, a switch SW, a plurality of transmission filters TF1 and TF2, and a plurality of reception filters RF1 and RF2.

The reception filter RF is mounted on one principal surface 20a of the multilayer board 20 and a sealing resin layer 31 covers the reception filter RF. The switch SW and the transmission filter TF are mounted on the other principal surface 20b of the multilayer board 20 and a sealing resin layer 32 covers the switch SW and the transmission filter TF. A ground electrode 25 is arranged between the transmission filter TF and the reception filter RF.

Figure 6B:
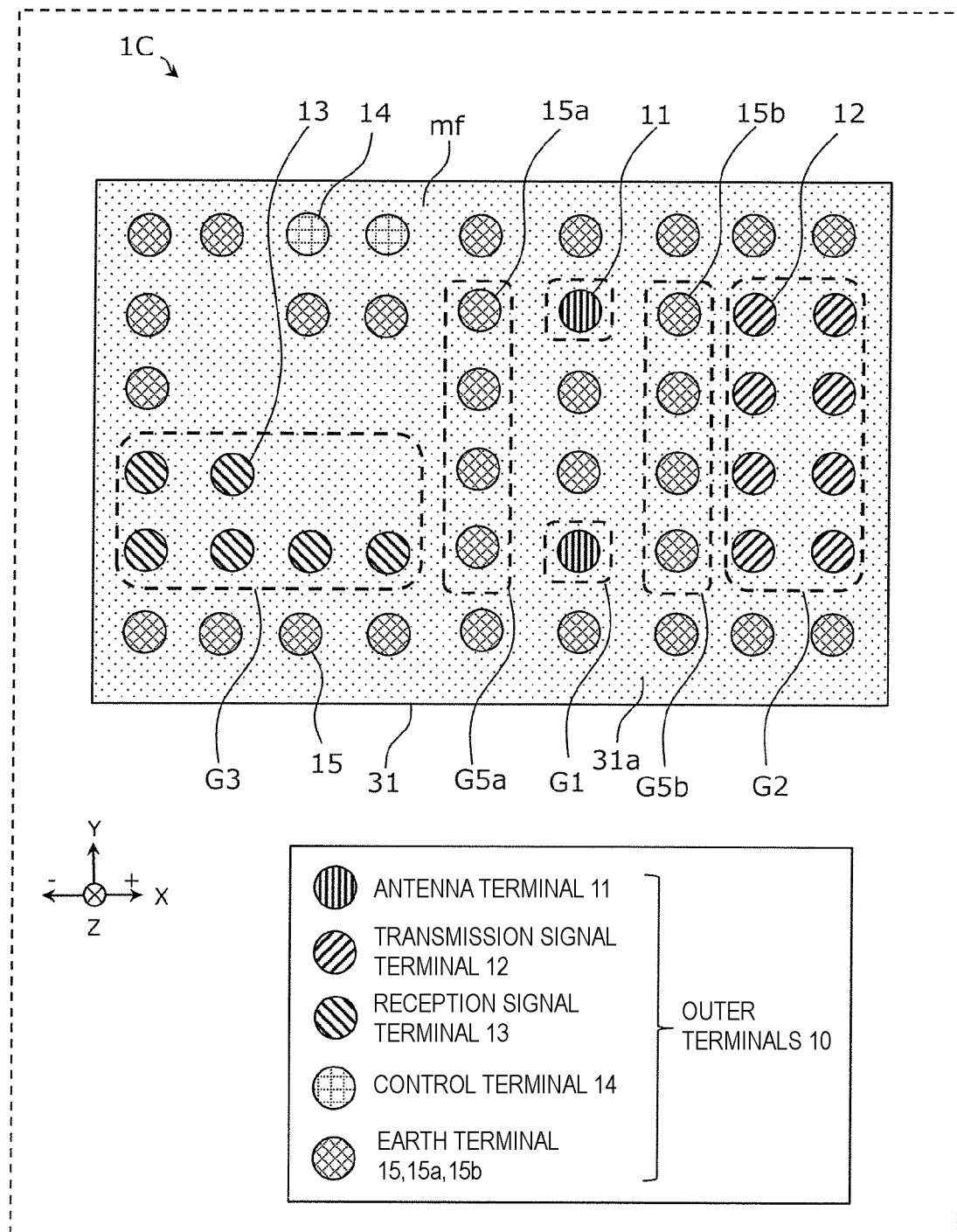
FIG. 6B is a plan view of the high-frequency module according to the third embodiment that is viewed from a mounting surface side.

FIG. 6B is a plan view of the high-frequency module 1C that is viewed from a mounting surface mf side. The mounting surface mf of the high-frequency module 1C has a substantially rectangular shape. A plurality of outer terminals 10 are arranged at the predetermined intervals along the long sides and the short sides of the mounting surface mf. Focusing on, for example, outer terminals 10 in a second row from the bottom out of the plurality of outer terminals 10, four reception signal terminals 13, one first earth terminal 15a, one antenna terminal 11, one second earth terminal 15b, and two transmission signal terminals 12 are arranged in this order along the long side.

In the high-frequency module 1C, subsets of the plurality of outer terminals 10 are grouped. For example, six reception signal terminals 13 arranged near the left short side constitute a terminal group G3 and eight transmission signal terminals 12 arranged near the right short side constitute a terminal group G2. Two antenna terminals 11 arranged between the terminal group G3 and the terminal group G2 constitute a terminal group G1. Four first earth terminals 15a arranged between the terminal group G3 and the terminal group G1 constitute a terminal group G5a. Four second earth terminals 15b arranged between the terminal group G1 and the terminal group G2 constitute a terminal group G5b.

In the high-frequency module 1C, the antenna terminal 11 is provided between the reception signal terminal 13 and the transmission signal terminal 12. The first earth terminal 15a is provided between the reception signal terminal 13 and the antenna terminal 11, thereby being capable of suppressing a decrease in the degree of isolation between the reception signal terminal 13 and the antenna terminal 11. The second earth terminal 15b is provided between the antenna terminal 11 and the transmission signal terminal 12, thereby being capable of suppressing a decrease in the degree of isolation between the antenna terminal 11 and the transmission signal terminal 12. The first earth terminal 15a and the second earth terminal 15b are provided between the reception signal terminal 13 and the transmission signal terminal 12, thereby being capable of suppressing a decrease in the degree of isolation between the reception signal terminal 13 and the transmission signal terminal 12.

In the high-frequency module 1C, the ground electrode 25 connected to the earth terminals 15a and 15b is arranged between the transmission filter TF and the reception filter RF. With this structure, isolation between the transmission filter TF and the reception filter RF can be secured.

Fourth Embodiment

Figure 7:
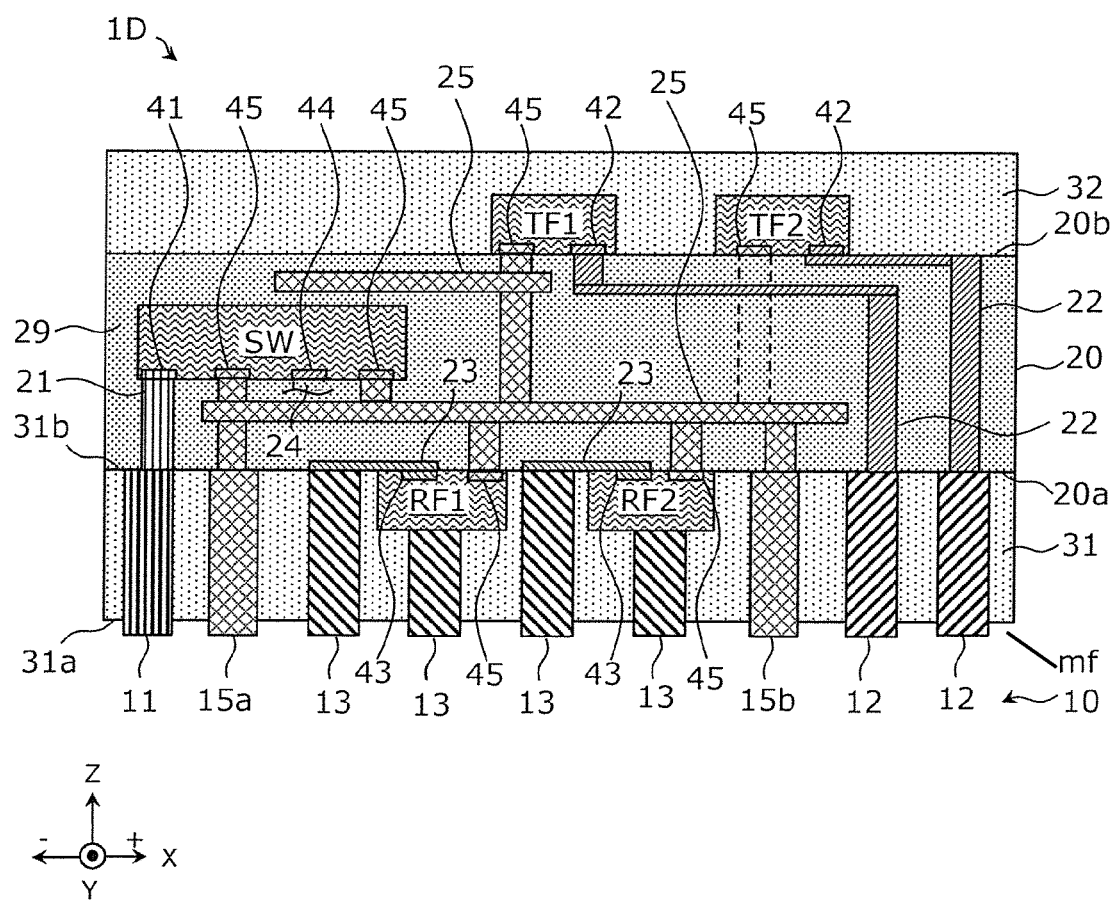
FIG. 7 is a schematic cross-sectional view of a high-frequency module according to a fourth embodiment.

FIG. 7 is a schematic cross-sectional view of a high-frequency module 1D according to a fourth embodiment. In the high-frequency module 1D of the fourth embodiment, the switch SW of the first embodiment is built in the multilayer board 20. Further, ground electrodes 25 are provided between the switch SW and the transmission filter TF and between the switch SW and the reception filter RF.

Figure 8:
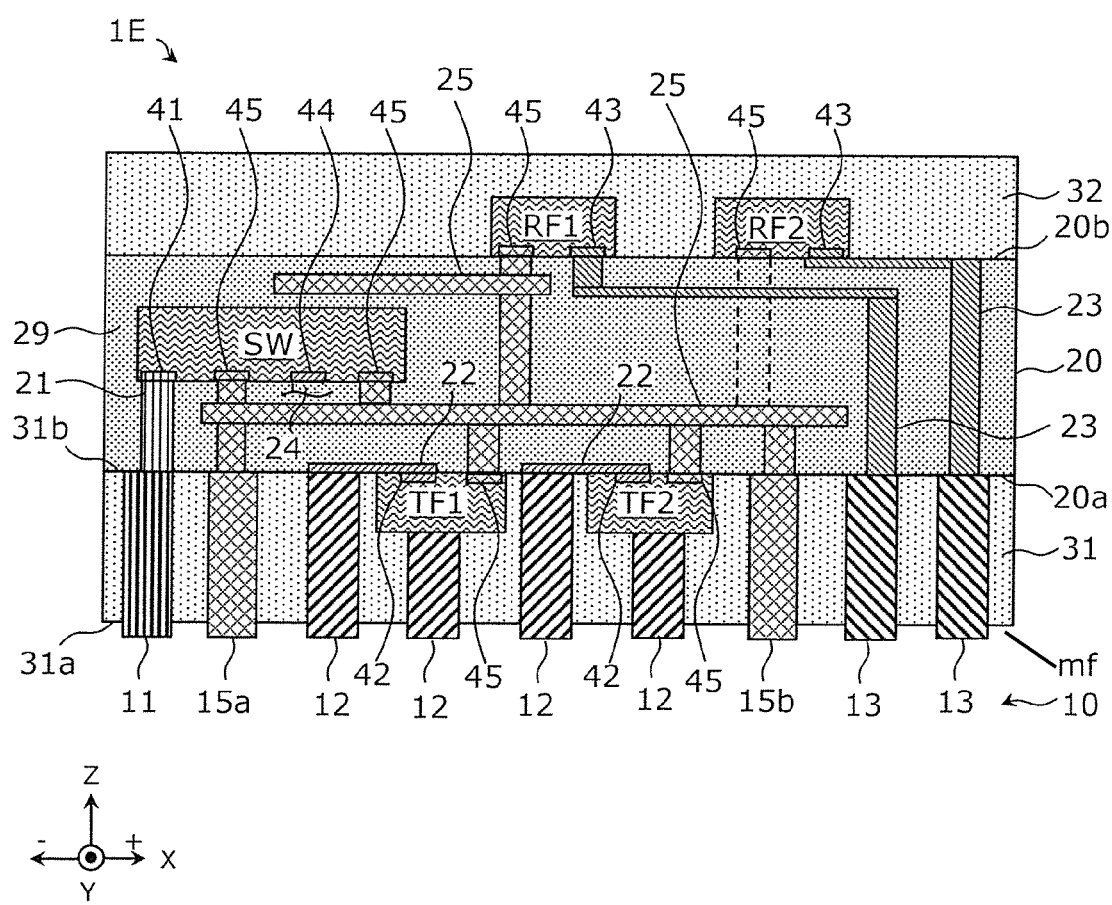
FIG. 8 is a schematic cross-sectional view of a high-frequency module according to a first modified example of the fourth embodiment.

FIG. 8 is a schematic cross-sectional view of a high-frequency module 1E according to a first modified example of the fourth embodiment. In the high-frequency module 1E of the first modified example of the fourth embodiment, the switch SW of the second embodiment is built in the multilayer board 20. Further, ground electrodes 25 are provided between the switch SW and the transmission filter TF and between the switch SW and the reception filter RF.

Figure 9:
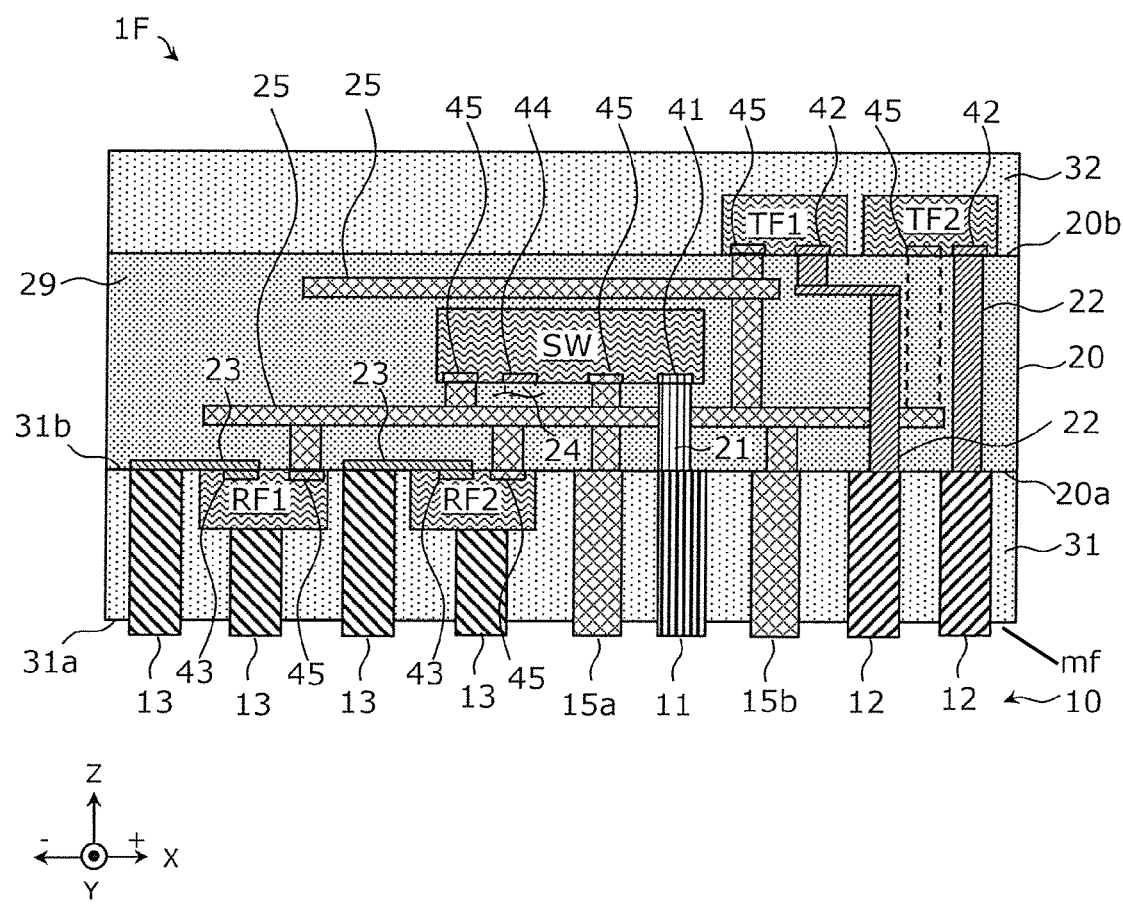
FIG. 9 is a schematic cross-sectional view of a high-frequency module according to a second modified example of the fourth embodiment.

FIG. 9 is a schematic cross-sectional view of a high-frequency module 1F according to a second modified example of the fourth embodiment. In the high-frequency module 1F of the second modified example of the fourth embodiment, the switch SW of the third embodiment is built in the multilayer board 20. Further, ground electrodes 25 are provided between the switch SW and the transmission filter TF and between the switch SW and the reception filter RF.

In the high-frequency modules 1D, 1E, and 1F, the switch SW is built in the multilayer board 20, thereby being capable of downsizing the high-frequency modules 1D, 1E, and 1F. The ground electrodes 25 are provided between the switch SW and the transmission filter TF and between the switch SW and the reception filter RF, thereby being capable of securing isolation between the switch SW and the transmission filter TF and between the switch SW and the reception filter RF.

Fifth Embodiment

In a high-frequency module 1G of a fifth embodiment, a ground electrode 25a connected to the reception filter RF and a ground electrode 25b connected to the transmission filter TF are separated from each other without being connected to each other.

Figure 10:
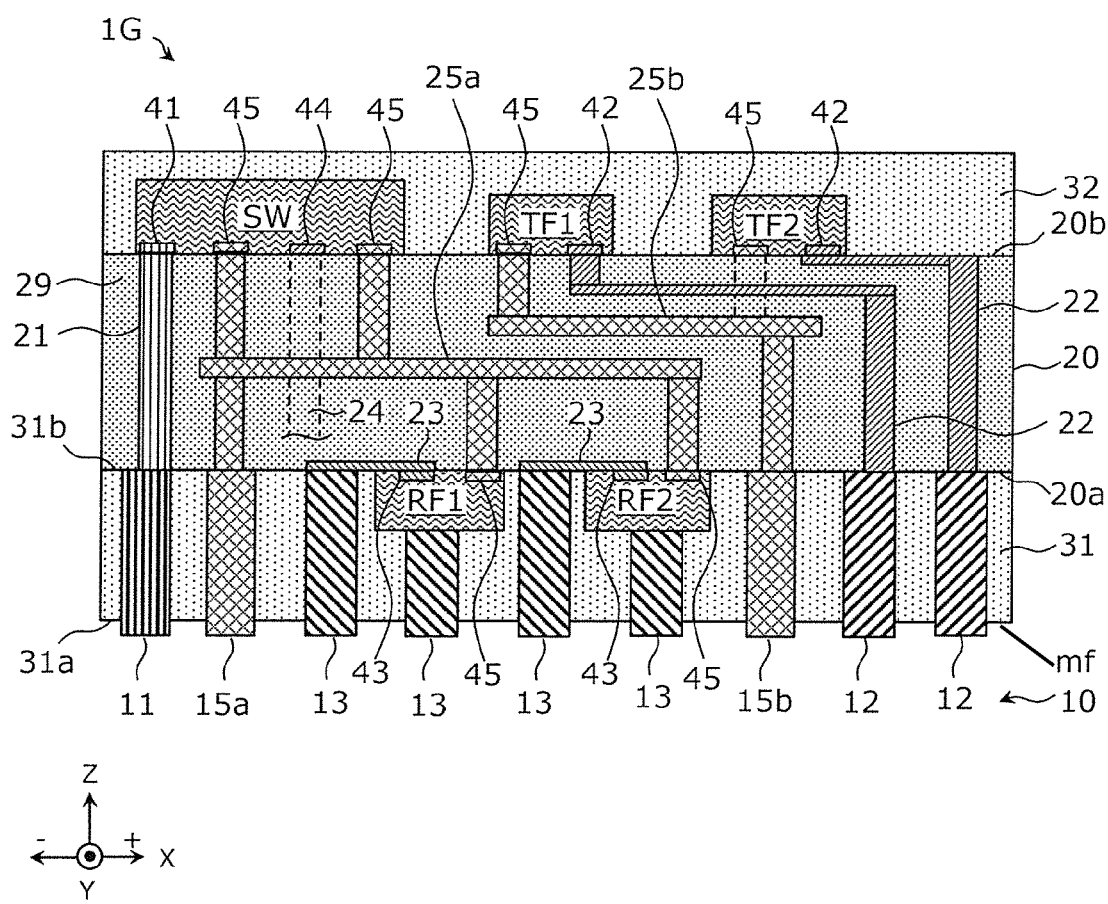
FIG. 10 is a schematic cross-sectional view of a high-frequency module according to a fifth embodiment.

FIG. 10 is a schematic cross-sectional view of the high-frequency module 1G according to the fifth embodiment. The high-frequency module 1G includes a multilayer board 20, a switch SW, a plurality of transmission filters TF1 and TF2, and a plurality of reception filters RF1 and RF2.

A ground terminal 45 of each of the transmission filters TF1 and TF2 is connected to an earth terminal 15b with the ground electrode 25b interposed therebetween. A ground terminal 45 of each of the reception filters RF1 and RF2 is connected to an earth terminal 15a with the ground electrode 25a interposed therebetween. Internal conductors of the ground electrodes 25a and 25b are arranged parallel to each other inside the multilayer board 20. The ground electrodes 25a and 25b are electrically separated from each other inside the multilayer board 20 without being connected to each other.

For example, if the ground electrodes 25a and 25b are connected to each other, a signal leaking from the ground terminal 45 of the transmission filter TF may be inputted to the ground terminal 45 of the reception filter RF and the reception sensitivity of the reception filter RF may decrease. Isolation between the transmission filter TF and the reception filter RF can be secured if the ground electrode 25a connected to the reception filter RF and the ground electrode 25b connected to the transmission filter TF are separated from each other without being connected to each other as in the high-frequency module 1G of the fifth embodiment.

The isolation is further improved if the ground electrodes 25a and 25b are not connected to each other on the principal surface 31b of the multilayer board 20 and are not electrically connected to each other inside the high-frequency module 1G.

Sixth Embodiment

In a high-frequency module 1H of a sixth embodiment, the reception filter RF of the first embodiment is built in the multilayer board 20. Further, the outer terminal 10 is shorter than the outer terminal 10 of the first embodiment.

Figure 11:
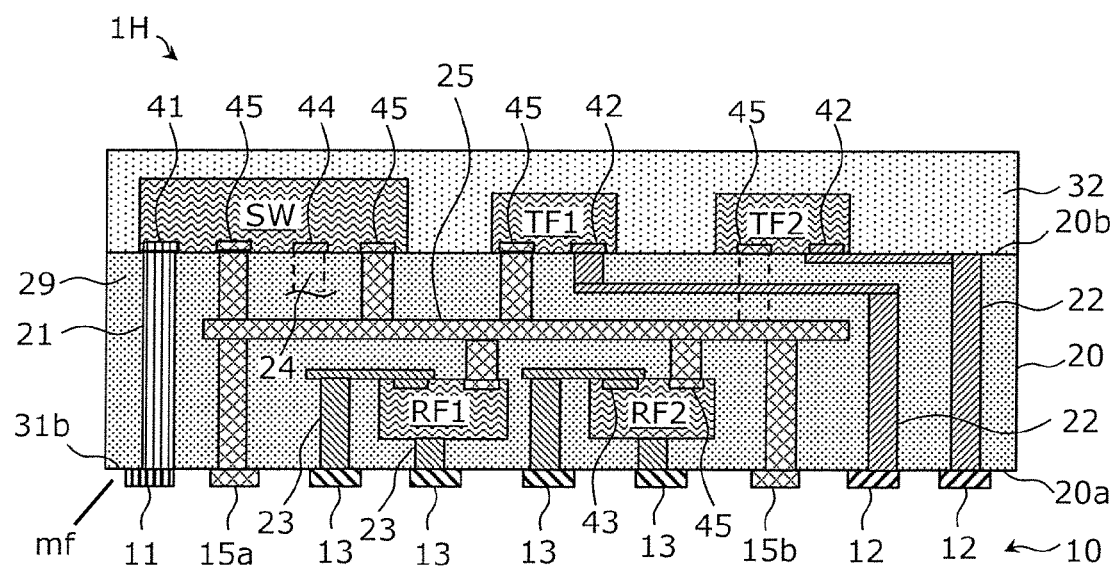
FIG. 11 is a schematic cross-sectional view of a high-frequency module according to a sixth embodiment.
Figure 11:
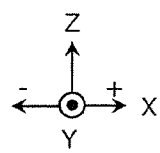

FIG. 11 is a schematic cross-sectional view of the high-frequency module 1H according to the sixth embodiment. The high-frequency module 1H includes a multilayer board 20, a switch SW, a plurality of transmission filters TF1 and TF2, and a plurality of reception filters RF1 and RF2.

The switch SW and the transmission filter TF are mounted on the other principal surface 20b of the multilayer board 20 and a sealing resin layer 32 covers the switch SW and the transmission filter TF.

In this embodiment, the reception filter RF is not mounted on one principal surface 20a of the multilayer board 20 but is built in the multilayer board 20. No sealing resin layer 31 is provided on the one principal surface 20a of the multilayer board 20. A ground electrode 25 is arranged between the transmission filter TF and the reception filter RF to suppress the interference between high-frequency signals in the transmission filter TF and the reception filter RF. The ground electrode 25 is arranged also between the switch SW and the reception filter RF.

Each outer terminal 10 is a substantially plate-shaped conductor. One end of the outer terminal 10 abuts against the one principal surface 20a of the multilayer board 20 and the other end of the outer terminal 10 protrudes from the one principal surface 20a. To mount the high-frequency module 1H on a mother board, the protruding portion of the outer terminal 10 is soldered to the mother board.

In the high-frequency module 1H, the reception filter RF is built in the multilayer board 20. Therefore, the high-frequency module 1H can be downsized. The transmission filter TF may be built in the multilayer board 20 instead of the reception filter RF.

Other Embodiments

Although the high-frequency modules according to the first to sixth embodiments of the present disclosure and their modified examples have been described above, the present disclosure is not limited to each of the first to sixth embodiments and the modified examples. Without departing from the spirit of the present disclosure, the scope of one or more aspects of the present disclosure encompasses various modifications conceivable by persons skilled in the art to the first to sixth embodiments and the modified examples, and embodiments implemented by combining constituent elements of different embodiments.

For example, the outer terminal 10 may have a substantially columnar shape or a substantially prismatic shape. The outer terminal 10 may protrude from the principal surface 31a of the sealing resin layer 31 or may be exposed flush with the principal surface 31a without protruding therefrom. The outer terminal 10 may be a copper post having a plating layer on its surfaces.

For example, the other principal surface 20b of the multilayer board 20 may be covered with the sealing resin layer 32 but need not essentially be covered therewith.

For example, the transmission filter TF or the reception filter RF may be a SAW filter or a BAW (Bulk Acoustic Wave) filter. Each of the transmission filter TF and the reception filter RF may be an acoustic wave device including an acoustic wave element for use in an arbitrary frequency band within a frequency band of about 500 MHz or higher and about 6 GHz or lower, for example, an acoustic wave element for use in a frequency band of about 500 MHz or higher and about 1500 MHz or lower.

For example, a plurality of signal paths may be connected to the antenna element 2. The high-frequency front end circuit 8 may support carrier aggregation.

The present disclosure is widely applicable to a mobile phone or other communication equipment as the high-frequency module, the high-frequency front end circuit, and the communication device that are excellent in isolation between outer terminals.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high-frequency module, comprising:
an antenna terminal;
a transmission signal terminal;
a reception signal terminal;
a plurality of earth terminals;
a switch connected to the antenna terminal;
a transmission filter arranged in a path connecting the switch and the transmission signal terminal, and connected to the switch and the transmission signal terminal;
a reception filter arranged in a path connecting the switch and the reception signal terminal, and connected to the switch and the reception signal terminal; and
a multilayer board provided with the antenna terminal, the transmission signal terminal, the reception signal terminal, the plurality of earth terminals, the switch, the transmission filter, and the reception filter,
wherein the multilayer board comprises a ground electrode arranged between the transmission filter and the reception filter and connected to the earth terminals,
wherein the plurality of earth terminals comprise:
a first earth terminal; and
a second earth terminal different from the first earth terminal, and
wherein, when the high-frequency module is viewed in a direction perpendicular to a principal surface of the multilayer board,
the reception signal terminal is provided between the antenna terminal and the transmission signal terminal,
the first earth terminal is provided between the antenna terminal and the reception signal terminal, and
the second earth terminal is provided between the reception signal terminal and the transmission signal terminal.

2. The high-frequency module according to claim 1, wherein a sealing resin layer is provided on one principal surface of the multilayer board, and
wherein the antenna terminal, the transmission signal terminal, the reception signal terminal, and the plurality of earth terminals are provided on the one principal surface of the multilayer board to extend through the sealing resin layer in a thickness direction.

3. The high-frequency module according to claim 2, wherein the transmission filter is provided on the one principal surface or another principal surface of the multilayer board, and
wherein the reception filter is provided on the one principal surface or the other principal surface where the transmission filter is not provided.

4. The high-frequency module according to claim 3, wherein the switch is provided on the other principal surface.

5. The high-frequency module according to claim 3, wherein the switch is built in the multilayer board.

6. The high-frequency module according to claim 2, wherein the antenna terminal comprises a plurality of antenna terminals, the transmission signal terminal comprises a plurality of transmission signal terminals, and the reception signal terminal comprises a plurality of reception signal terminals.

7. The high-frequency module according to claim 1, wherein the antenna terminal comprises a plurality of antenna terminals, the transmission signal terminal comprises a plurality of transmission signal terminals, and the reception signal terminal comprises a plurality of reception signal terminals.

8. The high-frequency module according to claim 7,
wherein the transmission filter is provided on the one principal surface or another principal surface of the multilayer board, and
wherein the reception filter is provided on the one principal surface or the other principal surface where the transmission filter is not provided.

9. The high-frequency module according to claim 1,
wherein the switch comprises one common terminal and a plurality of selection terminals,
wherein each of the plurality of selection terminals is connected to a corresponding one of the transmission filter and the reception filter, and
wherein the common terminal is connected to the antenna terminal and is simultaneously connected to the transmission filter and the reception filter with the plurality of selection terminals interposed therebetween.

10. The high-frequency module according to claim 1,
wherein the ground electrode comprises:
    a first ground electrode connected to a ground terminal of the transmission filter; and
    a second ground electrode connected to a ground terminal of the reception filter, and
wherein the first ground electrode and the second ground electrode are separated from each other inside the multilayer board without being connected to each other.

11. A high-frequency front end circuit, comprising:
the high-frequency module according to claim 1;
a power amplifier connected to the transmission signal terminal of the high-frequency module; and
a low-noise amplifier connected to the reception signal terminal of the high-frequency module.

12. A communication device, comprising:
the high-frequency front end circuit according to claim 11; and
a signal processing device configured to process a high-frequency signal.

13. A high-frequency module, comprising:
an antenna terminal;
a transmission signal terminal;
a reception signal terminal;
a plurality of earth terminals;
a switch connected to the antenna terminal;
a transmission filter arranged in a path connecting the switch and the transmission signal terminal, and connected to the switch and the transmission signal terminal;
a reception filter arranged in a path connecting the switch and the reception signal terminal, and connected to the switch and the reception signal terminal; and
a multilayer board provided with the antenna terminal, the transmission signal terminal, the reception signal terminal, the plurality of earth terminals, the switch, the transmission filter, and the reception filter,
wherein the multilayer board comprises a ground electrode arranged between the transmission filter and the reception filter and connected to the earth terminals,
wherein the plurality of earth terminals comprise:
    a first earth terminal; and
    a second earth terminal different from the first earth terminal, and
wherein, when the high-frequency module is viewed in a direction perpendicular to a principal surface of the multilayer board,
    the transmission signal terminal is provided between the antenna terminal and the reception signal terminal,
    the first earth terminal is provided between the antenna terminal and the transmission signal terminal, and
    the second earth terminal is provided between the transmission signal terminal and the reception signal terminal.

14. The high-frequency module according to claim 13,
wherein a sealing resin layer is provided on one principal surface of the multilayer board, and
wherein the antenna terminal, the transmission signal terminal, the reception signal terminal, and the plurality of earth terminals are provided on the one principal surface of the multilayer board to extend through the sealing resin layer in a thickness direction.

15. The high-frequency module according to claim 13,
wherein the antenna terminal comprises a plurality of antenna terminals, the transmission signal terminal comprises a plurality of transmission signal terminals, and the reception signal terminal comprises a plurality of reception signal terminals.

16. The high-frequency module according to claim 13,
wherein the switch comprises one common terminal and a plurality of selection terminals,
wherein each of the plurality of selection terminals is connected to a corresponding one of the transmission filter and the reception filter, and
wherein the common terminal is connected to the antenna terminal and is simultaneously connected to the transmission filter and the reception filter with the plurality of selection terminals interposed therebetween.

17. A high-frequency module, comprising:
an antenna terminal;
a transmission signal terminal;
a reception signal terminal;
a plurality of earth terminals;
a switch connected to the antenna terminal;
a transmission filter arranged in a path connecting the switch and the transmission signal terminal, and connected to the switch and the transmission signal terminal;
a reception filter arranged in a path connecting the switch and the reception signal terminal, and connected to the switch and the reception signal terminal; and
a multilayer board provided with the antenna terminal, the transmission signal terminal, the reception signal terminal, the plurality of earth terminals, the switch, the transmission filter, and the reception filter,
wherein the multilayer board comprises a ground electrode arranged between the transmission filter and the reception filter and connected to the earth terminals,
wherein the plurality of earth terminals comprise:
    a first earth terminal; and
    a second earth terminal different from the first earth terminal, and
wherein, when the high-frequency module is viewed in a direction perpendicular to a principal surface of the multilayer board,
    the antenna terminal is provided between the reception signal terminal and the transmission signal terminal,
    the first earth terminal is provided between the reception signal terminal and the antenna terminal, and
    the second earth terminal is provided between the antenna terminal and the transmission signal terminal.

18. The high-frequency module according to claim 17,
wherein a sealing resin layer is provided on one principal surface of the multilayer board, and wherein the antenna terminal, the transmission signal terminal, the reception signal terminal, and the plurality of earth terminals are provided on the one principal surface of the multilayer board to extend through the sealing resin layer in a thickness direction.

19. The high-frequency module according to claim 17, wherein the antenna terminal comprises a plurality of antenna terminals, the transmission signal terminal comprises a plurality of transmission signal terminals, and the reception signal terminal comprises a plurality of reception signal terminals.

20. The high-frequency module according to claim 17,
wherein the switch comprises one common terminal and a plurality of selection terminals,
wherein each of the plurality of selection terminals is connected to a corresponding one of the transmission filter and the reception filter, and
wherein the common terminal is connected to the antenna terminal and is simultaneously connected to the transmission filter and the reception filter with the plurality of selection terminals interposed therebetween.

* * * * *

UNITED STATES PATENT AND TRADEMARK OFFICE
CERTIFICATE OF CORRECTION

| | |
|---|---|
| PATENT NO. | : 11,196,451 B2 |
| APPLICATION NO. | : 16/815369 |
| DATED | : December 7, 2021 |
| INVENTOR(S) | : Kunitoshi Hanaoka |

It is certified that error appears in the above-identified patent and that said Letters Patent is hereby corrected as shown below:

In the Specification

Column 11, Line 20, "signal terminals (two" should be -- signal terminals 12 (two --.

Signed and Sealed this
Sixth Day of September, 2022

Katherine Kelly Vidal
*Director of the United States Patent and Trademark Office*